(12) United States Patent
D'Arcy et al.

(10) Patent No.: US 7,360,148 B2
(45) Date of Patent: Apr. 15, 2008

(54) REDUCTION CHECKSUM GENERATOR AND A METHOD OF CALCULATION THEREOF

(75) Inventors: Paul Gerard D'Arcy, Chelmsford, MA (US); Jesse Thilo, Bethlehem, PA (US); Kent E. Wires, Mine Hill, NJ (US)

(73) Assignee: Agere Systems Inc., Allentown, PA (US)

( * ) Notice: Subject to any disclaimer, the term of this patent is extended or adjusted under 35 U.S.C. 154(b) by 640 days.

(21) Appl. No.: 10/619,908

(22) Filed: Jul. 15, 2003

(65) Prior Publication Data
US 2005/0015423 A1    Jan. 20, 2005

(51) Int. Cl.
G06F 11/10    (2006.01)
H03M 13/07    (2006.01)

(52) U.S. Cl. ..................................... 714/807
(58) Field of Classification Search ............... 714/807, 714/809; H03M 13/07
See application file for complete search history.

(56) References Cited

U.S. PATENT DOCUMENTS

| | | | |
|---|---|---|---|
| 5,212,696 A * | 5/1993 | Norrod ........................ | 714/808 |
| 5,960,012 A | 9/1999 | Spracklen | |
| 6,256,756 B1 * | 7/2001 | Faulk, Jr. .................... | 714/718 |
| 6,324,670 B1 | 11/2001 | Henriksen | |
| 6,343,306 B1 * | 1/2002 | Lo .............................. | 714/807 |
| 6,412,092 B1 | 6/2002 | Raghunath | |
| 6,643,821 B2 * | 11/2003 | Karim et al. ................ | 714/807 |
| 6,941,396 B1 * | 9/2005 | Thorpe et al. ................ | 710/74 |
| 7,020,836 B2 * | 3/2006 | Beverly ....................... | 714/808 |

OTHER PUBLICATIONS

C. Perkins; Minimal Encapsulation Within IP; RFC 2004; Oct. 1996.
K. Bickerstaff, et al.; Parallel Reduced Area Multipliers; Journal of VLSI Signal Processing; vol. 9; Kluwer Academic Publishers, Boston; 1995; pp. 181-192.
I. Koren; Computer Arithmetic Algorithms; Prentice-Hall, Inc.; 1993; pp. 71-72 and pp. 108-111.
J. Postel; Internet Protocol; RFC 791; University of Southern California, Information Sciences Institute; Sep. 1981; pp. 1-45.
J. Postel; Transmission Control Protocol; RFC 793; University of Southern California, Information Sciences Institute; Sep. 1981; pp. 1-85.
J. Postel; IUser Datagram Protocol; RFC 768; Aug. 1980; pp. 1-3.
L. Dadda; Some Schemes For Parallel Multipliers; Alta Frequenza; vol. 34; pp. 349-356; 1965,
C.S. Wallace; A Suggestion For a Fast Multiplier; IEEE Transactions on Electronic Computers; Feb. 1964; pp. 14-17.

* cited by examiner

*Primary Examiner*—R. Stephen Dildine

(57) ABSTRACT

The present invention provides a reduction checksum generator for calculating a checksum value for a block of data. In one embodiment, the reduction checksum generator includes a reduction unit having a plurality of reduction stages and configured to pipeline a plurality of segments of the block of data through the plurality of reductions stages to reduce the plurality of segments to at least two segments. The reduction checksum generator also includes a checksum unit configured to generate a one's complement sum of the at least two segments and invert the one's complement sum to produce the checksum value. In addition, a method of calculating checksum value using reduction for a block of data and a parallel reduction checksum generator are also disclosed.

21 Claims, 8 Drawing Sheets

US 7,360,148 B2

REDUCTION CHECKSUM GENERATOR AND A METHOD OF CALCULATION THEREOF

TECHNICAL FIELD OF THE INVENTION

The present invention is directed, in general, to data communications and, more specifically, to a reduction checksum generator for calculating a checksum value for a block of data and a method of calculation.

BACKGROUND OF THE INVENTION

In today's networks and telecommunication systems, data is typically encapsulated into data messages or packets before transmission. A sending system, for example, may formulate one or more data messages and transmit them across the network. A designated receiving system receives the data messages and extracts the encapsulated data. During transmission, however, errors can be introduced into the data encapsulated in the data message causing the data to be corrupted. Also, the receiving system may erroneously interpret the transmission errors in the data as valid data. Accordingly, transmission error control has become an integral part of any system involved in data communications.

Transmission error control techniques include determining if an error occurred in a received message and discarding the message if an error did occur. One of the more well known transmission error detection techniques is checksum validation. More specifically, a checksum value is calculated for each message and appended to the message before transmission. Upon receiving the message, the receiving system generates its own checksum value for the received message and compares its checksum value to the checksum value in the message. If the checksum values match, then the message is valid and the encapsulated data can extracted and processed. If the checksum values to not match, the receiving system discards the message and requests re-transmission of the message.

FIG. 1 illustrates a block diagram of a conventional checksum generator, generally designated 100. The checksum generator 100 includes an adder 106. The adder 106 receives one word at a time from a message stored in a memory block 102 via line 104. The adder 106 adds the new word with a previous partial sum 110, which is fed back into the adder 106 via line 112. Typically, the partial sum 110 is either initialized to zero, or to a pre-computed partial checksum value. The result of the adder 106 is stored in the partial sum 110 via line 108. The partial sum 110 is a register that is twice as large as the size of the words in the memory block 102. More specifically, the partial sum 110 is 32-bits wide and each word in the memory block 102 is 16-bits wide. Since the partial sum 110 is twice as large as the words added, the sum produced by the adder 106 should not overflow. This eliminates the need for additional circuitry to account for a overflow (carry) resulting from the addition. The adder 106 continues to sequentially add each of the words in the memory block 102 to the previous partial sum 110 until all of the words in the memory block 102 for a particular message have been summed.

The checksum generator 100 passes a sum portion and an overflow portion of the partial sum 110 via lines 116, 114, respectively, to an adder 118. The adder 118 then adds the sum and overflow portions of the partial sum 110 together to produce a sum and possibly an overflow bit. The sum and the overflow bit are passed to the incrementer 122 via line 120. If the overflow bit is set, then the incrementer 122 increments the sum and passes the sum to the inverter 126 via line 124. The inverter 126 then inverts the sum and stores the result as the checksum value 130 via line 128.

The checksum generator 100 has a total delay that is approximately:

$$D_{convent} \approx \frac{N_{words} \cdot d_{add32}}{r} + d_{add16} + d_{ovfinv} \quad (1)$$

where $D_{convent}$ is the total delay, $N_{words}$ is the number of 16-bit words to be checksummed, $d_{add16}$ is the delay associated with each 16-bit addition, $d_{add32}$ is the delay associated with each 32-bit addition, $d_{ovfinv}$ is the delay associated with handling overflow from the final addition and inverting the result, and r is the number of parallel additions that can be performed simultaneously. The total delay $D_{convent}$ of the checksum generator 100 is basically a function of the number of words to be checksummed in relation to the types of registers employed. Due to the use of 32-bit adders and the high latency of such addition, the overall calculation is slow. As network throughput requirements are increased, this type of checksum generator and method may reduce network throughput or even cause a bottleneck.

Accordingly, what is needed in the art is a way to reduce the number of high-latency additions that are performed in calculating a checksum.

SUMMARY OF THE INVENTION

To address the above-discussed deficiencies of the prior art, the present invention provides a reduction checksum generator for calculating a checksum value for a block of data. In one embodiment, the reduction checksum generator includes: (1) a reduction unit having a plurality of reduction stages and configured to pipeline a plurality of segments of the block of data through the plurality of reductions stages to reduce the plurality of segments to at least two segments, and (2) a checksum unit configured to generate a one's complement sum of the at least two segments and invert the one's complement sum to produce the checksum value. For purposes of the present invention, the phrase "configured to" means that the device, the system or the subsystem includes the necessary, hardware and firmware to accomplish the stated task.

In another aspect, the present invention provides a method of calculating a checksum value using reduction for a block of data. In one embodiment, the method includes employing a plurality of reduction stages to reduce a plurality of segments of the block of data to at least two segments. The method further includes generating a one's complement sum of the at least two segments, incrementing the one's complement sum if the one's complement sum generates a carry, and inverting the one's complement sum to produce the checksum value.

In yet another aspect, the present invention provides a parallel reduction checksum generator. In one embodiment, the parallel reduction checksum generator includes a plurality of reduction units having a plurality of reduction stages, each of the plurality of reduction units pipelines M segments of the block of data through the plurality of reduction stages to reduce the M segments to N segments. The parallel reduction checksum generator further includes a second level reduction unit having a plurality of second level reduction stages, the second level reduction unit pipelines the N segments from each of the plurality of reduction units through the plurality of second level reduction stages to reduce the N segments from each of the plurality of reduction units to first and second checksum segments. The parallel reduction checksum generator still further includes a checksum unit that generates a one's complement sum of the first and second checksum segments, increments the one's complement sum if the one's complement sum produces a carry, and inverts the one's complement sum to produce the checksum value.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
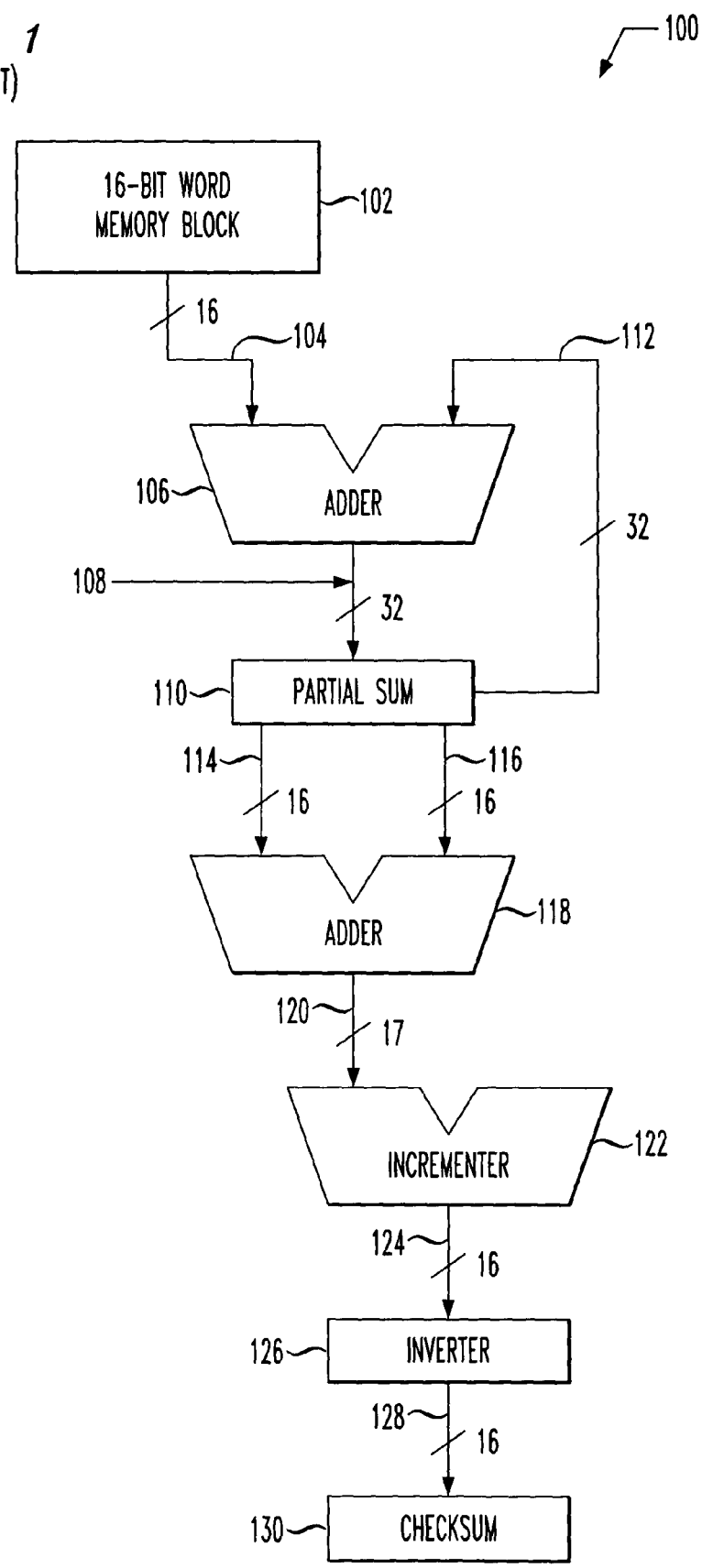
FIG. 1 illustrates a block diagram of a conventional checksum generator.
Figure 2:
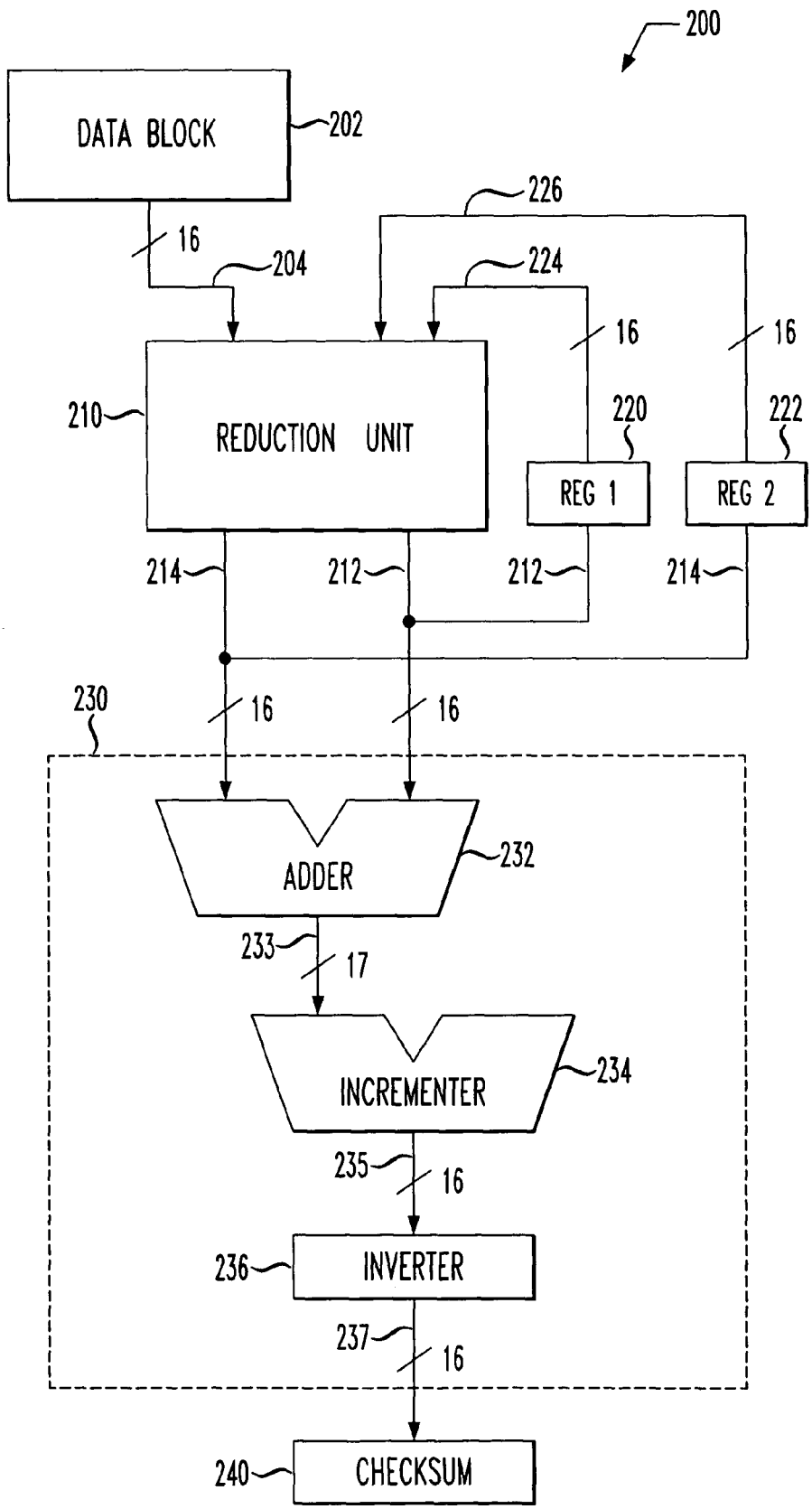
FIG. 2 illustrates a block diagram of an embodiment of a reduction checksum generator constructed according to the principles of the present invention.

Referring to FIG. 2, illustrated is a block diagram of an embodiment of a reduction checksum generator, generally designated 200, constructed according to the principles of the present invention. The reduction checksum generator 200 is configured to calculate a checksum value for a message stored in a block of data 202. The block of data 202 may be conventional memory or a special buffer associated with the reduction checksum generator 200. The block of data 202 may also hold multiple messages for processing by the reduction checksum generator 200. The block of data 202 is configured into segments, where each segment contains a specific number of bits. Typically, the number of bits in a segment is related to a word size that can be processed by the circuitry. For example, the word size could be 8-bits, 16-bits, 32-bits, 64-bits or 128-bits. For purposes of discussion only, FIG. 2 and the remaining FIGUREs will be discussed in terms of a segment containing 16-bits in order to simplify the discussion.

The reduction checksum generator 200 includes a reduction unit 210 and a checksum unit 230. The reduction unit 210 includes a plurality of reduction stages. See FIG. 3 for a discussion of reduction stages of the reduction unit. The reduction unit 210 is configured to receive multiple segments from the block of data 202 via a line (bus) 204 and pipeline the multiple segments through the plurality of reduction stages to reduce the multiple segments to at least two segments. The resulting at least two segments are passed to the checksum unit 230 via lines 212, 214. For example, the reduction unit 210 may receive twelve segments and reduce the twelve segments to two segments. In a related embodiment, the reduction unit 210 may pass the at least two segments to the checksum unit 230 sequentially via one line (bus).

In the illustrated embodiment, if the number of segments associated with a particular message stored in the block of data 202 is larger than the number of segments the reduction unit 210 is configured to reduce, the reduction checksum generator 200 may employ registers 220, 222 to iteratively reduce all of the segments of that particular message to at least two segments. More specifically, the reduction unit 210 will reduce a first set of segments to two segments and the two segments will be stored in registers 220, 222 via lines 212, 214, respectively. The contents of the registers 220, 222 are fed back into the reduction unit 210 via lines 224, 226, respectively, as part of the next set of segments to reduce. This continues until all of the segments for the message have been reduced to only two segments. Then, the final two segments are passed to the checksum unit 230. For example, if a message contains 22 segments and the reduction unit is configured to reduce twelve segments to two segments, the first twelve segments from the block of data 202 are passed to the reduction unit 210. The reduction unit 210 will reduce the twelve segments to two segments and store the two segments in the registers 220, 222. On the next iteration, the reduction unit 210 will receive the two segments from the registers 220, 222 and the last ten segments of the message from the block of data 202. The reduction unit 210 will reduce these segments to two segments and send the two segments to the checksum unit 230. Of course, however, the present invention is not limited to only two registers and two iterations. In other embodiments, the number of registers employed by the reduction checksum generator 200 may depend upon the number of segments produced by the reduction unit 210.

The checksum unit 230 is configured to generate a one's complement sum of the at least two segments produced by the reduction unit 210 and invert the one's complement sum to produce a checksum value 240. More specifically, the checksum unit 230, in the illustrated embodiment, includes an adder 232 that receives the at least two segments from the reduction unit 210 via lines 212, 214 and generates a one's complement sum of the at least two segments. The adder 232 passes the one's complement sum (16-bits) and an overflow (1-bit carry) via line 233 to an incrementer 234 of the checksum unit 230. The incrementer 234 will increment the one's complement sum if there was an overflow produced by the adder 232. The incrementer 234 passes the result (16-bits) via line 235 to an inverter 236 of the checksum unit 230. The inverter 236 inverts the one's complement sum to produce the checksum value 240 via line 237. The checksum value 240 can be used by other circuitry or systems to insert the checksum value into the message that will be transmitted or use the checksum value 240 to verify if a received message has communication error.

One skilled in the art should know that the reduction checksum generator 200 may have additional circuitry that is not illustrated. Also, in other embodiments, the checksum unit 230 may be a conventional checksum generator. In addition, the reduction checksum generator 200 may be embodied in hardware and firmware.

Figure 3:
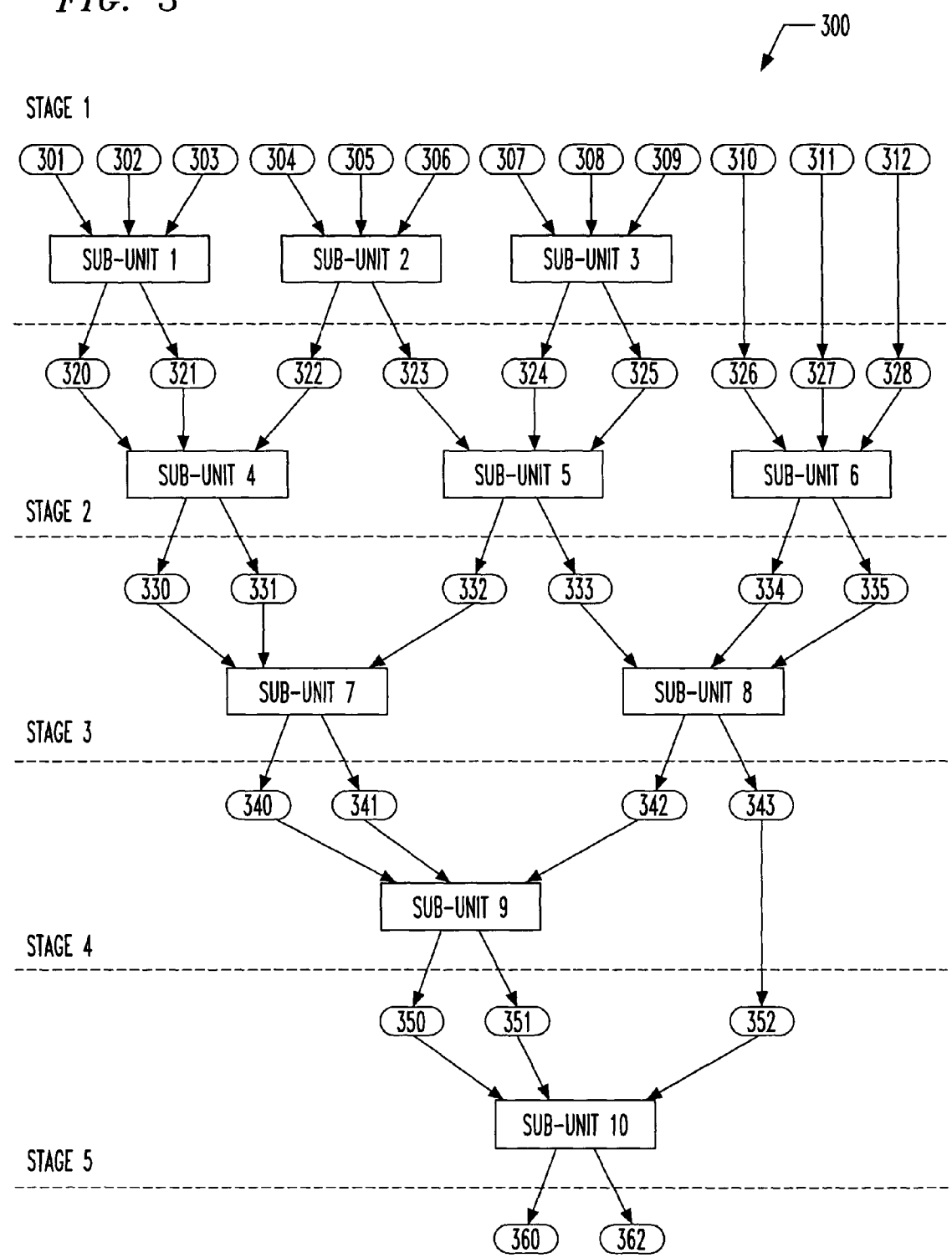
FIG. 3 illustrates a block diagram of an embodiment of a reduction unit of the reduction checksum generator of FIG. 2 constructed according to the principles of the present invention.

Turning now to FIG. 3, illustrated is a block diagram of an embodiment of a reduction unit, generally designated 300, of the reduction checksum generator 200 of FIG. 2 constructed according to the principles of the present invention. The reduction unit 300 includes a plurality of reduction stages and is configured to pipeline a plurality of segments through the reduction stages to reduce the plurality of segments to at least two segments. In the illustrated embodiment, the reduction unit 300 includes five reduction stages 1–5. Each of the reduction stages 1–5 includes at least one reduction sub-unit. A reduction sub-unit is configured to reduce three input segments to first and second output segments. See FIG. 4 for a more detailed description of an exemplary reduction sub-unit.

Each of the reduction stages 1–5 may reduce a number of input segments to a specific number of output segments based on a leveled reduction methodology. In leveled reduction, the input segments are reduced based upon a reduction sequence of 2, 3, 4, 6, 9, 13, 19, 28, 42, 63, 94, 141, . . . (See FIG. 5 for an example of leveled reduction checksumming and the reduction sequence.) This means that for a given number of segments (or rows), those segments are reduced to the next lower number of segments in the reduction sequence. For example, if there are twelve segments, those twelve segments are to be reduced to nine segments. Then, the nine segments are reduced to six segments, and so on until there are two segments.

In another embodiment, each of the reduction stages 1–5 may reduce a number of input segments to a specific number of output segments based on a 3-to-2 reduction methodology. (See FIG. 6 for an example of the 3-to-2 reduction checksumming.) In 3-to-2 reduction, every three input segments are reduced to two output segments and any remaining segments are passed to the next stage. For example, if there are twelve segments, those twelve segments are reduced to eight segments. Then, those eight segments are reduced to six segments. The six segments are reduced to four segments. The four segments are reduced to three segments. Finally, the three segments are reduced to two segments. In addition, the number of reduction stages may be based upon the number of sub-units that are implemented in the design.

FIG. 3 illustrates reduction stages for a leveled reduction methodology given twelve segments as inputs into the reduction unit 300. Using the leveled reduction sequence described above, the first reduction stage (STAGE 1) will employ three reduction sub-units 1–3 to reduce twelve input segments 301–312 to nine output segments 320–328. More specifically, the reduction sub-unit 1 will receive input segments 301–303 and reduce them to output segments 320, 321. The reduction sub-unit 2 will receive input segments 304–306 and reduce them to output segments 322, 323. The reduction sub-unit 3 will receive input segments 307–309 and reduce them to output segments 324, 325. The last three input segments 310–312 are not reduced and are passed through to the next stage as output segments 326–328.

In the second reduction stage (STAGE 2), the output segments 320–328 from the first reduction stage are the input segments to the second reduction stage. The second reduction stage employs three reduction sub-units 4–6 to reduce its nine input segments 320–328 to six output segments 330–335. More specifically, the reduction sub-unit 4 receives input segments 320–321 from the reduction sub-unit 1 of the first reduction stage and input segment 322 from the reduction sub-unit 2 of the first reduction stage. The reduction sub-unit 4 reduces the three input segments 320–322 to two output segments 330, 331. The reduction sub-unit 5 receives the input segment 323 from the reduction sub-unit 2 of the first reduction stage and input segments 324–325 from the reduction sub-unit 3 of the first reduction stage. The reduction sub-unit 5 reduces the three input segments 323–325 to two output segments 332, 333. The reduction sub-unit 6 receives the input segments 326–328, which were passed through the first reduction stage, and reduces them to two output segments 334, 335.

In the third reduction stage (STAGE 3), the output segments 330–335 produced from the second reduction stage are the input segments to the third reduction stage. The third reduction stage employs two reduction sub-units 7–8 to reduce its six input segments 330–335 to four output segments 340–343. More specifically, the reduction sub-unit 7 receives two input segments 330, 331 from the reduction sub-unit 4 of the second reduction stage and the input segment 332 from the reduction sub-unit 5 of the second reduction stage. The reduction sub-unit 7 reduces the input segments 330–332 to two output segments 340, 341. The reduction sub-unit 8 receives the input segment 333 from the reduction sub-unit 5 of the second reduction stage and two input segments 334–335 from the reduction sub-unit 6 of the second reduction stage. The reduction sub-unit 8 reduces the three input segments 333–335 to two output segments 342, 343.

In the fourth reduction stage (STAGE 4), the output segments 340–343 produced from the third reduction stage are the input segments to the fourth reduction stage. The fourth reduction stage employs a single reduction sub-unit 9 to reduce its four input segments 340–343 to three output segments 350–352. More specifically, the reduction sub-unit 9 receives two input segments 340, 341 from the reduction sub-unit 7 of the third reduction stage and the input segment 342 from the reduction sub-unit 8 of the third reduction stage. The reduction sub-unit 9 reduces the input segments 340–342 to two output segments 350, 351. The remaining input segment 343 is passed through to the next reduction stage as output segment 352.

In the fifth reduction stage (STAGE 5), the output segments 350–352 produced from the fourth reduction stage are the input segments to the fifth reduction stage. The fifth reduction stage employs a single reduction sub-unit 10 to reduce its three input segments 350–352 to two output segments 360, 361. More specifically, the reduction sub-unit 10 receives two input segments 350, 351 from the reduction sub-unit 9 of the fourth reduction stage and the input segment 352, which was passed through the fourth reduction stage. The reduction sub-unit 10 reduces the input segments 350–352 to the final two output segments 360, 361. These two output segments 360, 361 would then be passed to a checksum unit similar to the checksum unit 230 of FIG. 2.

One skilled in the art should know that the present invention is not limited to five reduction stages, twelve input segments and two output segments. In other embodiments, the reduction unit 300 may have any number of reduction stages and the number of reduction stages may depend upon the reduction method employed and the number of segments the reduction unit 300 is configured to accommodate. The number of reduction stages may also depend upon the number of input segments and the number of output segments produced by the reduction unit 300. In addition, the reduction unit 300, in another embodiment, may employ other reduction methods to reduce the input segments to at least two output segments. Also, the reduction unit 300 may include additional circuitry that is not illustrated.

Figure 4:
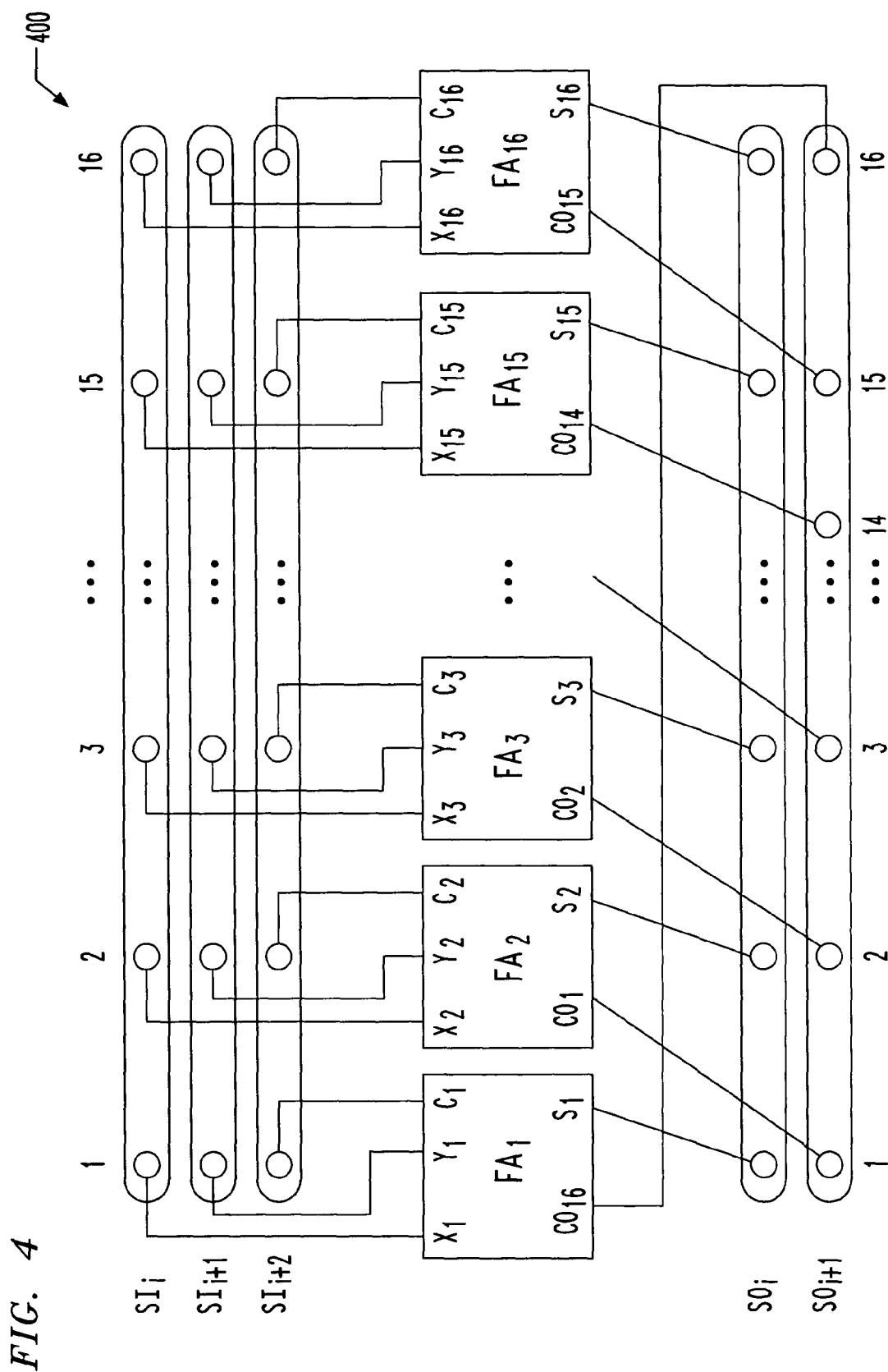
FIG. 4 illustrates a block diagram of an embodiment of a reduction sub-unit constructed according to the principles of the present invention.

Turning now to FIG. 4, illustrated is a block diagram of an embodiment of a reduction sub-unit, generally designated 400, constructed according to the principles of the present invention. The reduction sub-unit 400 is configured to receive three input segments $SI_i$, $SI_{i+1}$, $SI_{i+2}$ and reduce them to a first output segment $SO_i$ and a second output segment $SO_{i+1}$. The reduction sub-unit 400 also includes a full adder for each bit in a segment. In the illustrated embodiment, the reduction sub-unit 400 would include sixteen full adders $FA_1$–$FA_{16}$ since each segment contains 16-bits. One skilled in the art is familiar with full adders and how they operate.

Each of the full adders $FA_1$–$FA_{16}$ receives three input bits from the same bit position in the three input segments $SI_i$, $SI_{i+1}$, $SI_{i+2}$ and produces a sub bit and a carry out bit. For example, assuming that bit position 16 is the least significant bit position, the full adder $FA_{16}$ will receive as its X input ($X_{16}$) bit 16 of the first segment $SI_i$. The Y input ($Y_{16}$) is bit 16 of the second segment $SI_{i+1}$ and the carry-in ($C_{16}$) is bit 16 of the third segment $SI_{i+2}$. The full adder $FA_{16}$ will generate a sum bit $S_{16}$ and a carry-out bit $CO_{15}$. The sum bit $S_{16}$ is stored in bit position 16 (least significant bit position) of the first output segment $SO_i$. The carry-out bit $CO_{15}$ is stored bit shifted left in bit position 15 of the second output segment $SO_{i+1}$. The full adders $FA_2$ through $FA_{15}$ are similar to the last full adder $FA_{16}$ and operate in the same manner. The most significant bit position full adder $FA_1$ receives its input $X_1$, $Y_1$, $C_1$ from bit position one of the three input segments $SI_i$, $SI_{i+1}$, $SI_{i+2}$. The sum bit $S_1$ generated by the first full adder $FA_1$ is stored in bit position 1 (most significant bit position) of the first output segment $SO_i$. The carry-out bit $CO_{16}$ generated by the first full adder $FA_1$ is stored in the least significant bit position (bit position 16) of the second output segment $SO_{i+1}$. This advantageously allows the reduction sub-unit 400 to account for any overflow that may occur in adding the three segments together. Of course, however, the present invention is not limited to only sixteen full adders. The present invention may employ a full adder for each bit in a segment and the segments can be of any word size. In addition, the reduction sub-unit 400 may also include additional circuitry that is not illustrated.

Figure 5:
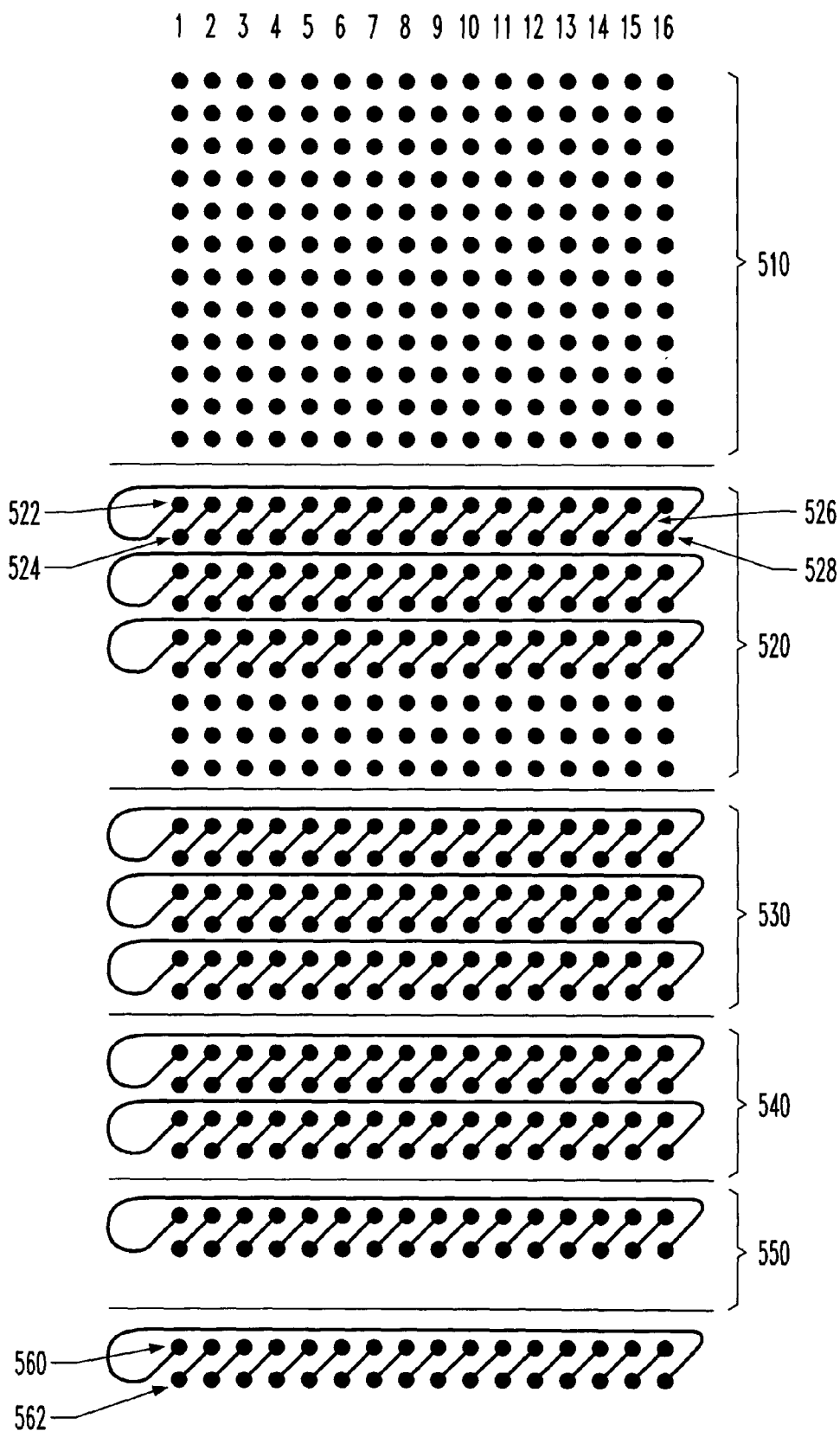
FIG. 5 illustrates a diagram of an example of a leveled reduction based checksumming that may be employed by the reduction checksum generator of FIG. 2 according to the principles of the present invention.

Turning now to FIG. 5, illustrated is a diagram of an example of a leveled reduction based checksumming that may be employed by the reduction checksum generator of FIG. 2 according to the principles of the present invention. In FIG. 5, each row of dots represents a segment of data and each dot represents an individual bit within the segment. The leveled reduction method employed by the present invention is a modified method of reduction based on Dadda's reduction method for parallel multipliers. For additional information on Dadda's reduction method, see "Some Schemes for Parallel Multipliers," by L. Dadda, Alta Frequanza, Vol. 34, pp. 349–356 (1965), and "Parallel Reduced Area Multipliers," by K. Bickerstaff, et al., Journal of VLSI Signal Processing, Vol. 9, pp. 187–192 (1995), both of which are hereby incorporated by reference in their entirety.

In leveled reduction, the number of rows (segments of data) is reduced based on a reduction sequence of 2, 3, 4, 6, 9, 13, 19, 28, 42, 63, 94, 141, 211 and 316. In addition, the leveled reduction reduces in groups of three rows. Each group of three rows is reduced to two rows. In the first stage of leveled reduction, the total number of rows to be reduced or the total number of rows the reduction unit 210 of FIG. 2 can accommodate is determined. Next, the last number in the reduction sequence that is less than the total number of rows to be reduced is determined. That number in the reduction sequence is the starting point for the leveled reduction method. The leveled reduction then reduces the rows based on the reduction sequence until there are only two rows. For example, in FIG. 5, the total number of rows in the first stage 510 is 12. The last number in the reduction sequence that is less than 12 is 9. Thus, the first reduction is from 12 rows to 9 rows.

The second stage 520 of the leveled reduction illustrates the results of the reduction from 12 rows to 9 rows. To reduce from 12 rows to 9 rows, the leveled reduction reduces three groups of three rows to three groups of two rows and the last three rows are passed through. In reducing three rows to two rows, the leveled reduction produces first and second rows 522, 524, respectively. The first row 522 contains the sum bits from the addition. The second row 524 contains the carry-out bits from the addition. See FIG. 4 for a discussion reducing three rows to two rows using full adders. In the illustrated embodiment, the dots connected by a bar, such as a bar 526, indicate that the upper right dot in the first row 522 is the sum bit and the lower left dot in the second row 524 is the associated carry-out bit of the full adder. The carry-out bits are also bit shifted left one bit position in the second row 524. Also, the carry-out bit associated with the sum bit in the most significant bit position (bit 1) is stored in the least significant bit position 528 (bit 16) in the second row 524, which accounts for the overflow handling of one's complement addition without introducing additional hardware, such as overflow detection logic and additional incrementers.

The third stage 530 of the leveled reduction illustrates the results of reducing the 9 rows in the second stage 520 to 6 rows according to the reduction sequence. The fourth stage 540 of the leveled reduction illustrates the results of reducing the 6 rows in the third stage 530 to 4 rows according to the reduction sequence. The fifth stage 550 of the leveled reduction illustrates the results of reducing the 4 rows in the fourth stage 540 to three rows. Finally, the 3 rows in the fifth stage 550 are reduced to the final two rows 560, 562.

As described above, the leveled reduction method employs full adders, such as in the reduction sub-unit 400 of FIG. 4, in each stage to reduce three rows of data to two rows of data. The delay of reducing all of the rows to two rows using leveled reduction is approximately:

$$D_L \approx M_{Lstages} \cdot d_{FA} \qquad (2)$$

where $D_L$ is the total delay, $M_{Lstages}$ is the number of stages required to reduce the original number of rows (matrix) to two rows, and $d_{FA}$ is the delay of a full adder. Since each full adder in a given stage can function substantially simultaneously, the delay of each stage in the leveled reduction method equals $d_{FA}$. Thus, the total delay is $d_{FA}$ times the number of reduction stages. In this example, the original 12 rows is reduced to nine, then six, four, three and finally two rows. This constitutes five stages of reduction. If the delay of a full adder is estimated to be two gate delays, the total delay of reducing 12 rows to 2 rows using leveled reduction is approximately ten gate delays.

Figure 6:
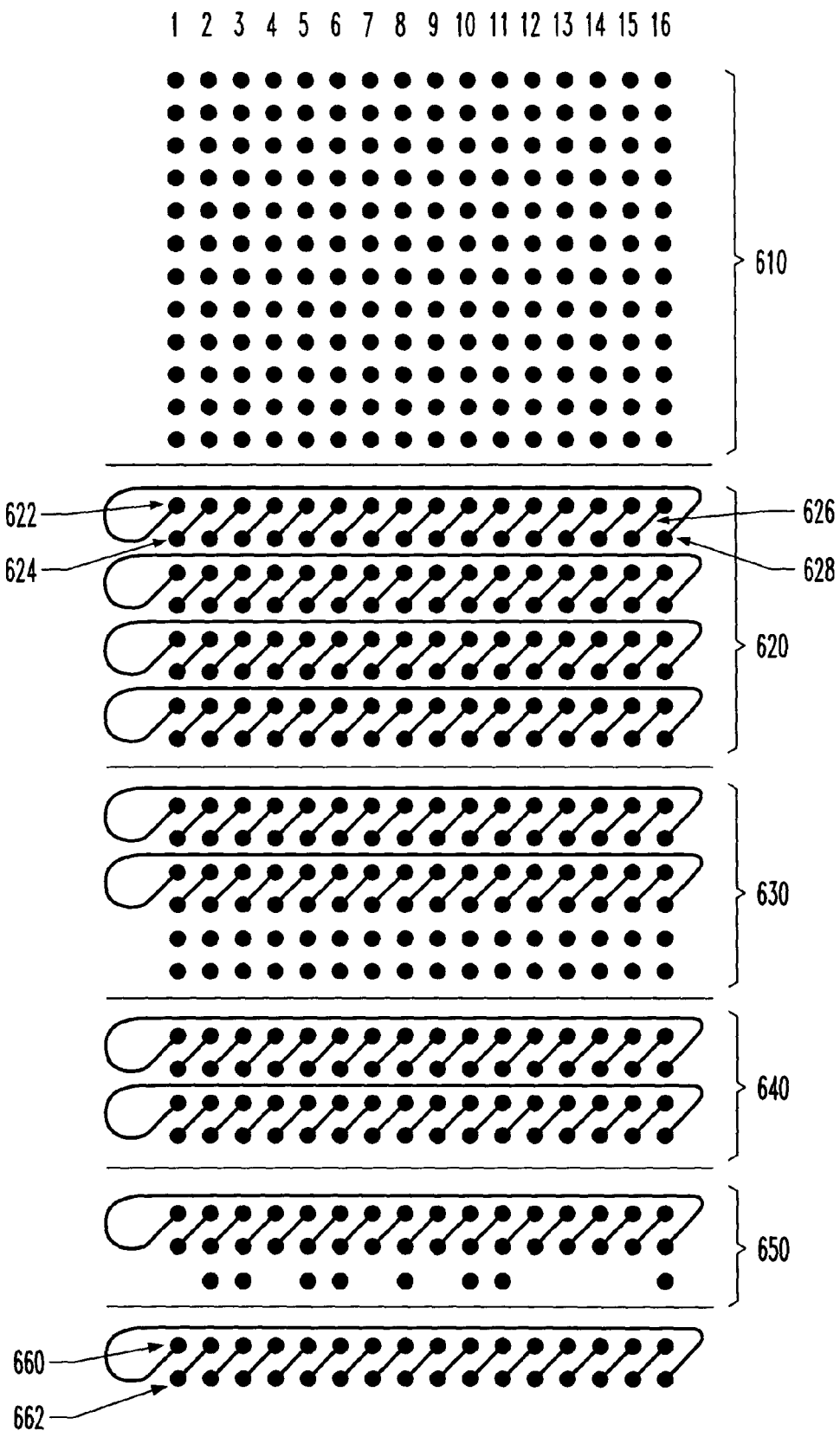
FIG. 6 illustrates a diagram of an example of a 3-to-2 reduction based checksumming that may be employed by the reduction checksum generator of FIG. 2 according to the principles of the present invention.

Turning now to FIG. 6, illustrated is a diagram of an example of 3-to-2 reduction based checksumming that may be employed by the reduction checksum generator of FIG. 2 according to the principles of the present invention. In FIG. 6, each row of dots represents a segment of data and each dot represents an individual bit within the segment. The 3-to-2 reduction method employed by the present invention is a modified method of reduction based on Wallace's reduction method for parallel multipliers. For additional information on Wallace's reduction method, see "Suggestion for a Fast Multiplier," by C. S. Wallace, IEEE Transactions on Electronic Computers, Vol. EC-13, pp. 14–17 (1964). Also see, "Parallel Reduced Area Multipliers," by K. Bickerstaff, et al., Journal of VLSI Signal Processing, Vol. 9, pp. 187–192 (1995). The above references are hereby incorporated by reference in their entirety.

In 3-to-2 reduction, the number of rows (segments of data) that are reduced per stage is based on groups of three rows. In each group of three rows, the three rows are reduced to two rows. The 3-to-2 reduction employs reduction sub-units having full adders, similar to the reduction sub-unit 400 of FIG. 4, to reduce three rows to two rows. Also, any row or rows that are left over, are passed to the next stage. For example, in FIG. 6, the first stage 610 of the 3-to-2 reduction contains 12 rows, which makes up four groups of three rows. Thus, the 3-to-2 reduction method will first reduce all 12 rows to 8 rows.

The second stage 620 of the leveled reduction illustrates the results of the reduction from 12 rows to 8 rows. In reducing three rows to two rows, the 3-to-2 reduction produces first and second rows 622, 624, respectively. The first row 622 contains the sum bits from the addition. The second row 624 contains the carry-out bits from the addition. In the illustrated embodiment, the dots connected by a bar, such as a bar 626, indicate that the upper right dot in the first row 622 is the sum bit and the lower left dot in the second row 624 is the sum bit's associated carry-out bit. The carry-out bits are also bit shifted left one bit position in the second row 624. Also, the carry-out bit associated with the sum bit in the most significant bit position (bit 1) is stored in the least significant bit position 628 (bit 16) in the second row 624, which accounts for the overflow handling of one's complement addition without introducing additional hardware, such as overflow detection logic and additional incrementers.

The third stage 630 of the 3-to-2 reduction illustrates the results of reducing the 8 rows in the second stage 620 to 6 rows. More specifically, since there are only two groups of three rows, those six rows are reduced to four rows. The remaining two rows in the second stage 620 are passed to the third stage 630. This results in a total of 6 rows for the third stage 630. The fourth stage 640 of the 3-to-2 reduction illustrates the results of reducing the 6 rows in the third stage 630 to 4 rows (two groups of three rows). The fifth stage 650 of the 3-to-2 reduction illustrates the results of reducing the 4 rows in the fourth stage 640 to three rows. Since there is only one group of three rows in the fourth stage 640, the three rows are reduced to two rows and the last row is passed through. Finally, the 3 rows in the fifth stage 650 are reduced to the final two rows 660, 662.

As described above, the 3-to-2 reduction method employs full adders, such as in the reduction sub-unit 400 of FIG. 4, in each stage to reduce three rows of data to two rows of data. The delay of reducing all of the rows to two rows using 3-to-2 reduction is approximately:

$$D_{3\text{-}2} \approx M_{3\text{-}2stages} \cdot d_{FA} \quad (3)$$

where $D_{3\text{-}2}$ is the total delay, $M_{3\text{-}2stages}$ is the number of stages required to reduce the original number of rows (matrix) to two rows, and $d_{FA}$ is the delay of a full adder. Since each full adder in a given stage can function substantially simultaneously, the delay of each stage in the 3-to-2 reduction method equals $d_{FA}$. Thus, the total delay is $d_{FA}$ times the number of reduction stages. In this example, the original 12 rows is reduced to eight, then six, four, three and finally two rows. This constitutes five stages of reduction. If the delay of a full adder is estimated to be two gate delays, the total delay of reducing 12 rows to 2 rows using 3-to-2 reduction is approximately ten gate delays.

The leveled reduction method and the 3-to-2 reduction method both have a total delay that is $d_{FA}$ times the number of reduction stages, which can be represented as $M \cdot d_{FA}$. (See equations 2 and 3.) Given this, the total delay of the reduction checksum generator 200 of FIG. 2 can be calculated for either type of reduction method as:

$$D \approx (M \cdot d_{FA}) \cdot N_{itr} + d_{add16} + d_{ovfinv} \quad (4)$$

where D is the total delay, M is the number of stages in the reduction unit used to reduce a set of segments (rows) to two rows, $d_{FA}$ is the delay of a full adder, $N_{itr}$ is the number of iterations for the reduction unit to reduce all of the segments (rows) of a particular message, $d_{add16}$ is the delay associated with each 16-bit addition, such as the adder, and $d_{ovfinv}$ is the delay associated with handling the overflow from the final addition and inverting the result.

Figure 7:
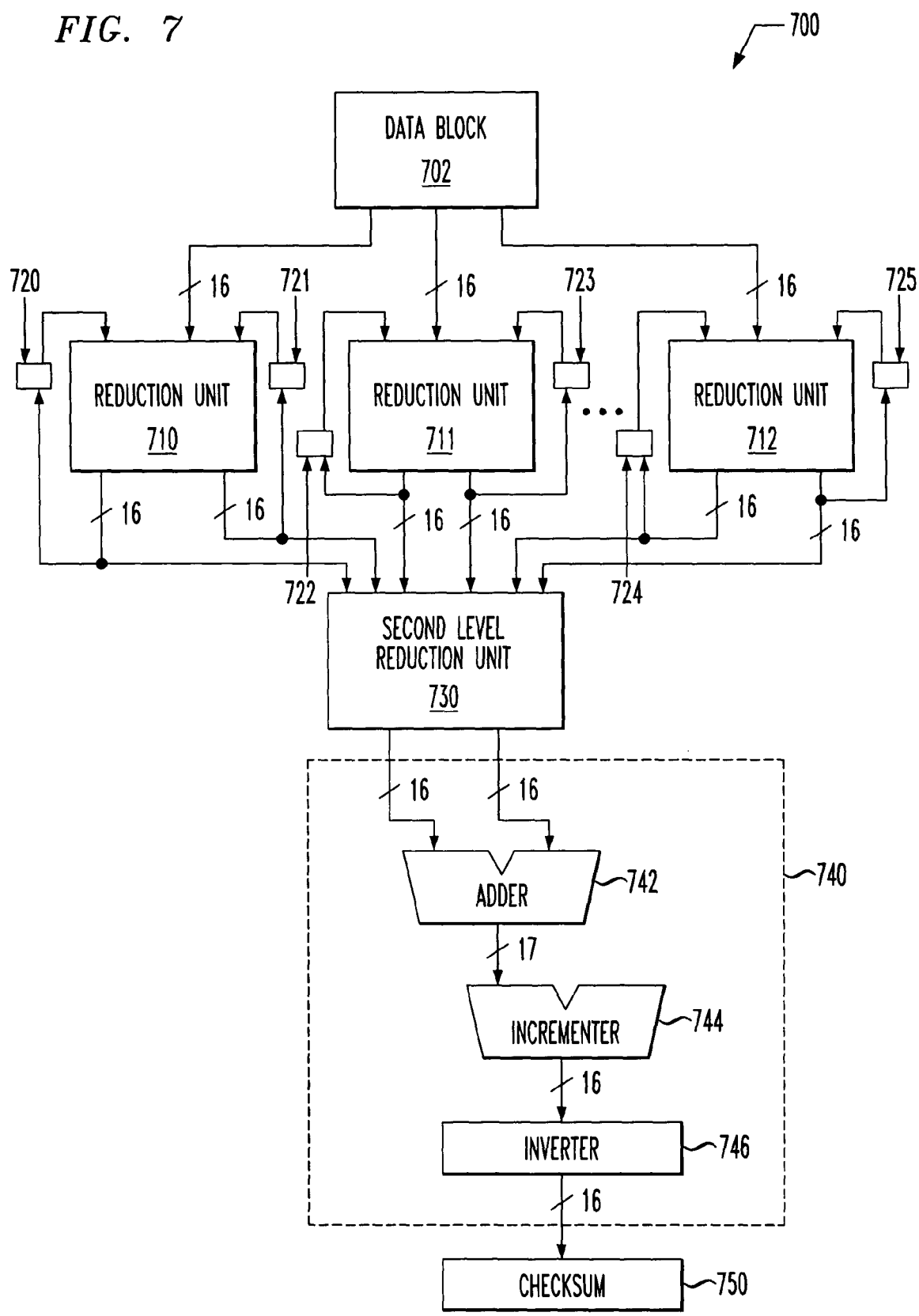
FIG. 7 illustrates a block diagram of an embodiment of a parallel reduction checksum generator constructed according to the principles of the present invention.

Turning now to FIG. 7, illustrated is a block diagram of an embodiment of a parallel reduction checksum generator, generally designated 700, constructed according to the principles of the present invention. The parallel reduction checksum generator 700 is configured to employ a plurality of reduction units 710–712 in calculating a checksum value for a message stored in a block of data 702. The block of data 702 is similar to the block of data 202 of FIG. 2 and is configured into segments of data.

Each of the reduction units 710–712 is similar to and has the same functionality as the reduction unit 210 of FIG. 2, and may operate substantially in parallel. Also, each of the reduction units 710–712 may receive the same number of segments from the block of data 702 at a time and pipeline the segments through internal reduction stages (not shown) to reduce the received segments to at least two segments. See FIGS. 3–4 for a discussion on the reduction stages and how the segments are reduced. The reduction units 710–712 may employ leveled reduction to reduce the segments. In another embodiment, the reduction units 710–712 may employ 3-to-2 reduction to reduce the segments. In addition, each of the reduction units 710–712 may employ registers 720–725 to iteratively reduce all of the segments of a particular message in the block of data 702. Typically, there are two registers associated with each of the reduction units 710–712 and provide temporary storage of the output segments that will be used in the next iteration.

The parallel reduction checksum generator 700 also includes a second level reduction unit 730. The second level reduction unit 730 is similar to and has the same functionality as the reduction unit 210 of FIG. 2. The second level reduction unit 730 is configured to receive the at least two segments from each of the reduction units 710–712 and process the segments through internal reduction stages (not shown) to reduce the segments from all of the reduction units 710–712 to first and second checksum segments. If each of the reduction units 710–712 reduces M segments to N segments, the second level reduction unit 730 would have to be able to reduce N times the number of reduction units segments to two segments (first and second checksum segments). For example, if there are three reduction units and each of the reduction units reduced twelve segments to two segments, then the second level reduction unit 730 should be capable of reducing six segments (two output segments times three units) to first and second checksum segments.

The parallel reduction checksum generator 700, in one embodiment, also includes a checksum unit 740. The checksum unit 740 is configured to receive the first and second checksum segments from the second level reduction unit 730 and generate a one's complement sum of the first and second checksum segments. The checksum unit 740 is further configured to increment the one's complement sum if the addition of the first and second checksum segments produced a carry (or overflow), and invert the one's complement sum to produce a checksum value 750.

In the illustrated embodiment, the checksum unit 740 includes an adder 742 that receives the first and second checksum segments from the second level reduction unit 730 and generates a one's complement sum of the first and second checksum segments. The adder 742 passes the one's complement sum (16-bits) and an overflow (1-bit carry) to an incrementer 744 of the checksum unit 740. The incrementer 744 increments the one's complement sum if an overflow was produced by the adder 742. The incrementer 744 passes the result to an inverter 746 of the checksum unit 740. The inverter 746 inverts the one's complement sum to produce the checksum value 750.

One skilled in the art should know that the parallel reduction checksum generator 700 may have additional circuitry that is not illustrated. Also, in other embodiments, the checksum unit 740 may be a conventional checksum generator. In addition, the parallel reduction checksum generator 700 may be embodied in hardware and firmware.

The total delay for the parallel reduction checksum generator 700 would be based on two sets of reduction units. More specifically, since the multiple reduction units 710–712 operate substantially parallel, their delay would be the same as a single reduction unit. Also, the parallel reduction checksum generator 700 also has a second level reduction unit 730 that has its own delay. In addition, each of the reduction units 710–712 and the second level reduction unit 730 may employ either of the leveled reduction method or the 3-to-2 reduction method, which has the same delay calculations. See equations 2 and 3. Given this, the total delay of the parallel reduction checksum generator 700 can be calculated for either type of reduction method as:

$$D_p \approx (M_1 \cdot d_{FA}) \cdot N_{itr} + (M_2 \cdot d_{FA}) + d_{add16} + d_{ovfinv} \quad (5)$$

where $D_p$ is the total delay for the parallel reduction checksum generator, $M_1$ is the number of stages in the reduction unit used to reduce a set of segments to at least two segments, $d_{FA}$ is the delay of a full adder, $N_{itr}$ is the number of iterations for the reduction units to reduce all of the segments of a particular message, $M_2$ is the number of stages in the second level reduction unit, $d_{add16}$ is the delay associated with each 16-bit addition, such as the adder, and $d_{ovfinv}$ is the delay associated with handling the overflow from the final addition and inverting the result.

Table 7-1, illustrates the delays of the reduction checksum generator (equation 4) and the parallel reduction checksum generator (equation 5) compared against a conventional checksum generator (equation 1) for calculating a checksum for a 160-segment block of data. Table 7-1 also illustrates different implementations and different reduction methods of each type of checksum generator. For each of the conventional checksum generator implementations, it is assumed that the overflow additions can be performed in parallel with the data word additions. The total delay results are given in terms of gate delays $(_G)$. The gate counts for each type of implementation are also listed in Table 7-1.

TABLE 7.1

| Implementation | Gates | Delay $(_G)$ |
|---|---|---|
| Conventional | | |
| one adder | 400 | 1459 |
| two adders | 784 | 748 |
| eighty adders | 30,736 | 91 |
| Leveled, Single Unit | | |
| one pass (211 level) | 16,928 | 43 |
| three passes (63 level) | 5,088 | 71 |
| eleven passes (19 level) | 1,568 | 147 |
| Leveled, Three Units | | |
| one pass (63 level) | 15,168 | 43 |
| two passes (28 level) | 6,768 | 53 |
| 3-to-2, Single Unit | | |
| one pass (160 level) | 12,848 | 43 |
| three passes (55 level) | 4,448 | 73 |
| eleven passes (17 level) | 1,408 | 149 |
| 3-to-2, Three Units | | |
| one pass (54 level) | 13,008 | 43 |
| two passes (27 level) | 6,528 | 53 |

Figure 8:
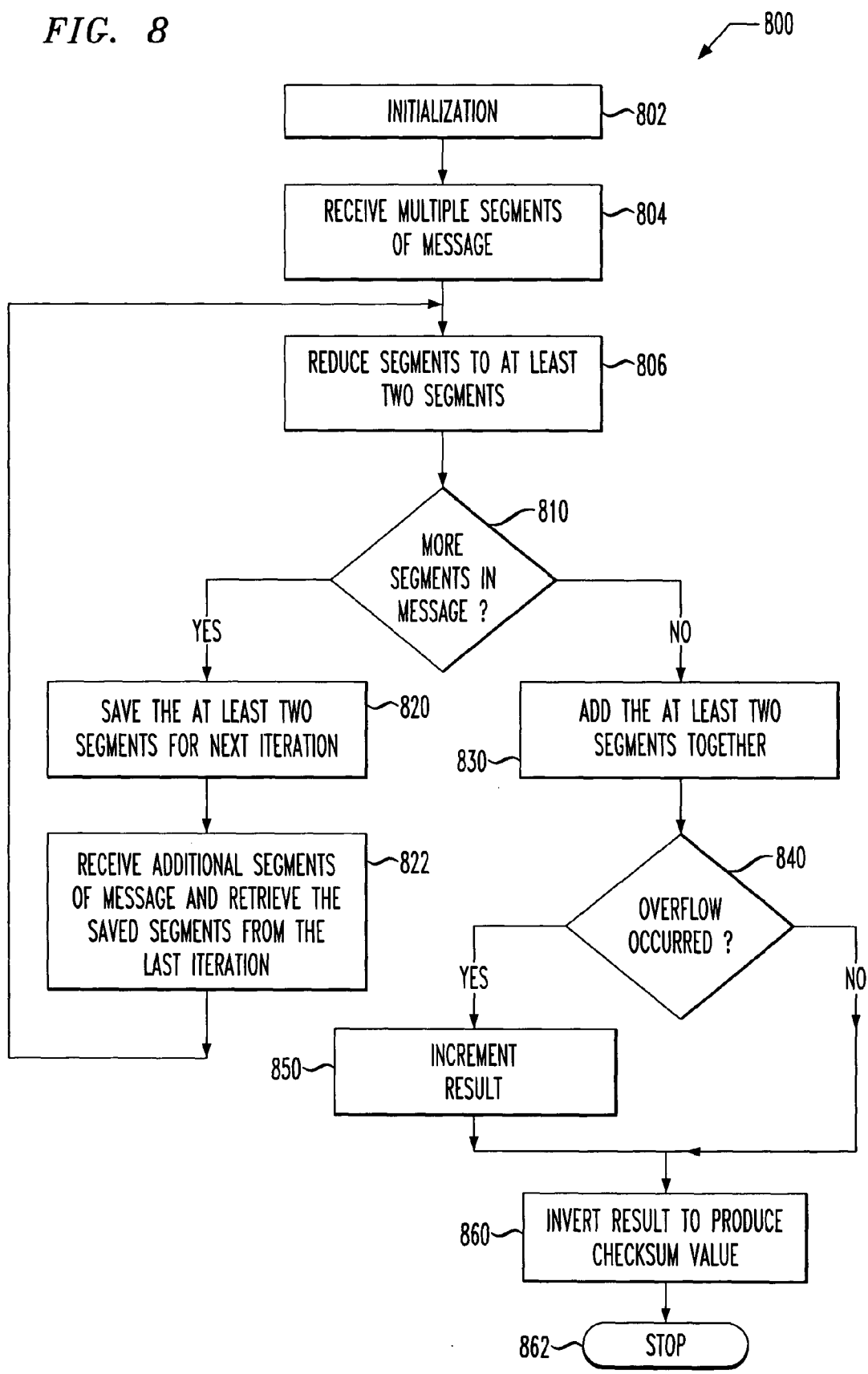
FIG. 8 illustrates a flow diagram of an embodiment of a method for calculating a checksum value using reduction for a block of data conducted according to the principles of the present invention.

Turning now to FIG. 8, illustrated is a flow diagram of an embodiment of a method for calculating a checksum value using reduction, generally designated 800, for a block of data conducted according to the principles of the present invention. In FIG. 8, the method 800 first performs initialization in a step 802.

After initialization, the method 800 receives multiple segments of a message to calculate a checksum value for in a step 804. As discussed previously, a segment contains bits of data and is similar to a word of data. Next, the method 800 employs reduction stages to reduce the multiple segments to at least two segments in a step 806. See FIGS. 3 and 4 for a discussion of reduction stages and reducing segments. In one embodiment, the method 800 may employ leveled reduction to reduce the multiple segments to at least two segments. See FIG. 5 for a discussion on leveled reduction. In another embodiment, the method 800 may employ 3-to-2 reduction to reduce the multiple segments to at least two segments. See FIG. 6 for a discussion on 3-to-2 reduction.

The method 800 then determines if there are more segments in the message to reduce in a decisional step 810. This may occur if there are more segments than can be reduced at one time. If there are more segments to reduce, the method 800 saves the at least two segments for the next iteration of reduction in a step 820. The method 800 may employ registers to store the at least two segments between the iterations. Next, the method 800 receives additional segments of the message and retrieves the saved segments from the last iteration in a step 822. The saved segments are used as part of the total number of segments that can be reduced at one time. The method 800 then returns to reduce the new segments and the saved at least two segments in the step 806.

If the method 800 determined that there are no more segments of the message to reduce in the decisional step 810, the method 800 then adds the at least two segments together in a step 830. The method 800 then determines if an overflow occurred (carry) due to the addition in a decisional step 840. If an overflow occurred, the method 800 then increments the result of the addition to account for the overflow in a step 850. If an overflow did not occur or the step 850 was performed, the method 800 then inverts the result to produce a checksum value for the message in a step 860. The method 800 then stops processing in a step 862. The method 800, in another embodiment, may alternatively return to the step 804 to process another message.

One skilled in the art should know that the present invention is not limited to calculating a checksum for a single message. Also, the present invention and method may perform multiple functions, such as reduction, at the same time. In another embodiment, the method 800 may send the at least two segments to a conventional checksum generator instead of performing steps 830 through 860. In addition, other embodiments of the present invention may have additional or fewer steps than described above.

While the methods disclosed herein have been described and shown with reference to particular steps performed in a particular order, it will be understood that these steps may be combined, subdivided, or reordered to form an equivalent method without departing from the teachings of the present invention. Accordingly, unless specifically indicated herein, the order and/or the grouping of the steps are not limitations of the present invention.

Although the present invention has been described in detail, those skilled in the art should understand that they can make various changes, substitutions and alterations herein without departing from the spirit and scope of the invention in its broadest form.

What is claimed is:

1. A computer-implemented reduction checksum generator for calculating a checksum value for a block of data, comprising:
    a reduction unit having a plurality of reduction stages and configured to pipeline a plurality of segments of said block of data through said plurality of reductions stages to reduce said plurality of segments to at least two segments; and
    a checksum unit configured to generate a one's complement sum of said at least two segments and invert said one's complement sum to produce said checksum value.

2. The reduction checksum generator as recited in claim 1 wherein said reduction checksum generator further comprises at least two registers, said reduction unit is further configured to iteratively reduce said block of data by storing said at least two segments in said at least two registers between iterations and using said at least two segments as part of said plurality of segments in a next iteration if said block of data contains a number of segments greater than said plurality of segments.

3. The reduction checksum generator as recited in claim 1 wherein each of said plurality of reduction stages includes at least one reduction sub-unit, said at least one reduction sub-unit is configured to reduce three input segments to first and second output segments.

4. The reduction checksum generator as recited in claim 3 wherein said at least one reduction sub-unit having full adders, each of said full adders configured to receive one bit from each of said three input segments associated with a same bit position.

5. The reduction checksum generator as recited in claim 4 wherein said first output segment contains sum bits from said full adders, said second output segment contains carry outputs from said full adders bit shifted left and a most significant one of said carry outputs stored in a least significant bit position of said second output segment.

6. The reduction checksum generator as recited in claim 3 wherein said reduction unit is further configured to pass non-reduced segments from one of said plurality of reduction stages to another of said plurality of reduction stages if a total number of input segments for said one of said plurality of reduction stages is greater than a number of said input segments reduced by said plurality of reduction sub-units within said one of said plurality of reduction stages.

7. The reduction checksum generator as recited in claim 1 wherein said plurality of reduction stages are configured to employ a leveled reduction or a 3-to-2 reduction to reduced said plurality of segments to said at least two segments.

8. A computer-readable storage medium having encoded thereon a computer readable program which, when executed by a computer, carries out the following method for calculating a checksum value using reduction for a block of data, comprising:
    employing a plurality of reduction stages to reduce a plurality of segments of said block of data to at least two segments; and
    generating a one's complement sum of said at least two segments, incrementing said one's complement sum if said one's complement sum generates a carry, and inverting said one's complement sum to produce said checksum value.

9. The method as recited in claim 8 wherein said employing includes interatively reducing said block of data by saving said at least two segments between iterations and using said at least two segments as part of said plurality of segments in a next iteration if said block of data contains a number of segments greater that said plurality of segments.

10. The method as recited in claim 8 wherein each of said plurality of reduction stages includes at least one reduction sub-unit, said at least one reduction sub-unit reduces three input segments to first and second output segments.

11. The method as recited in claim 10 wherein each of said at least one reduction sub-unit having full adders, each of said full adders receives one bit from each of said three input segments associated with a same bit position.

12. The method as recited in claim 11 wherein said employing includes storing sum bits from said full adders in said first output segment, storing said carry outputs from said full adders in a bit shifted left position in said second output segment, and storing a most significant one of said carry outputs in a least significant bit position in said second output segment.

13. The method as recited in claim 10 wherein said employing includes passing non-reduced segments from one of said plurality of reduction stages to another of said plurality of reduction stages if a total number of input segments for said one of said plurality of reduction stages is greater than a number of said input segments reduced by said plurality of reduction sub-units within said one of said plurality of reduction stages.

14. The method as recited in claim 8 wherein said employing said plurality of reduction stages to reduce said plurality of segments includes employing a leveled reduction or a 3-to-2 reduction to reduced said plurality of segments to said at least two segments.

15. A computer-implemented parallel reduction checksum generator for calculating a checksum value for a block of data, comprising:
    a plurality of reduction units having a plurality of reduction stages, each of said plurality of reduction units pipelines M segments of said block of data through said plurality of reduction stages to reduce said M segments to N segments;
    a second level reduction unit having a plurality of second level reduction stages, said second level reduction unit pipelines said N segments from each of said plurality of reduction units through said plurality of second level reduction stages to reduce said N segments from said each of said plurality of reduction units to first and second checksum segments; and
    a checksum unit that generates a one's complement sum of said first and second checksum segments, increments said one's complement sum if said one's complement sum produces a carry, and inverts said one's complement sum to produce said checksum value.

16. The parallel reduction checksum generator as recited in claim 15 wherein said parallel reduction checksum generator further comprises N registers for each of said plurality of reduction units, each of said reduction units iteratively reduce said block of data by storing said N segments in said N registers between iterations and using said N segments as part of said M segments in a next iteration if said block of data contains a number of segments greater than said M segments times a number of said plurality of reduction units.

17. The parallel reduction checksum generator as recited in claim 15 wherein each of said plurality of reduction stages and each of said plurality of second level reduction stages include at lease one reduction sub-unit, said at least one reduction sub-unit is configured to reduce three input segments to first and second output segments.

18. The parallel reduction checksum generator as recited in claim 17 wherein said at least one reduction sub-unit having full adders, each of said full adders configured to receive one bit from each of said three input segments associated with a same bit position.

19. The parallel reduction checksum generator as recited in claim 18 wherein said first output segment contains sum bits from said full adders, said second output segment contains carry outputs from said full adders bit shifted left and a most significant one of said carry outputs being stored in a least significant bit position of said second output segment.

20. The parallel reduction checksum generator as recited in claim 17 wherein each of said plurality of reduction units pass non-reduced segments from one of said plurality of reduction stages to another of said plurality of reduction stages if a total number of input segments for said one of said plurality of reduction stages is greater than a number of said input segments reduced by said plurality of reduction sub-units within said one of said plurality of reduction stages.

21. The parallel reduction checksum generator as recited in claim 15 wherein said plurality of reduction stages employ a leveled reduction or a 3-to-2 reduction to reduced said M segments to said N segments, and said plurality of second level reduction stages employ a leveled reduction or a 3-to-2 reduction to reduce said N segments from each of said plurality of reduction unit to said first and second checksum segments.

* * * * *